(12) United States Patent
Nadler

(10) Patent No.: US 6,191,656 B1
(45) Date of Patent: Feb. 20, 2001

(54) HIGH EFFICIENCY, UNILATERAL DUAL STAGE RF AMPLIFIER

(75) Inventor: Alexander John Nadler, Greensboro, NC (US)

(73) Assignee: RF Micro Devices, Inc., Greensboro, NC (US)

( * ) Notice: Under 35 U.S.C. 154(b), the term of this patent shall be extended for 0 days.

(21) Appl. No.: 09/360,212

(22) Filed: Jul. 23, 1999

(51) Int. Cl.⁷ .................................................. H03F 1/30
(52) U.S. Cl. ........................ 330/288; 330/289; 330/290
(58) Field of Search .................................. 330/288, 289, 330/290, 296, 310, 311

(56) References Cited

U.S. PATENT DOCUMENTS

| | | | |
|---|---|---|---|
| 4,935,705 | 6/1990 | Estanislao et al. | 330/296 |
| 5,410,275 | 4/1995 | Black | 330/288 |
| 5,455,968 | 10/1995 | Pham | 455/127 |
| 5,477,192 | 12/1995 | Black et al. | 330/228 |
| 5,548,248 | * 8/1996 | Wang | 330/288 |
| 5,608,353 | 3/1997 | Pratt | 330/295 |
| 5,629,648 | 5/1997 | Pratt | 330/289 |
| 5,705,953 | * 1/1998 | Jesser | 330/290 |
| 5,757,236 | 5/1998 | Ortiz et al. | 330/296 |
| 5,757,237 | 5/1998 | Staudinger et al. | 330/296 |
| 5,854,578 | * 12/1998 | Minasi et al. | 330/289 X |

\* cited by examiner

*Primary Examiner*—Steven J. Mottola
(74) *Attorney, Agent, or Firm*—Rhodes & Mason, P.L.L.C.

(57) ABSTRACT

An RF power amplifier has an RF driver stage that also provides a temperature independent reference current to the RF output power amplifier. A diode reference serves as both a DC current reference and as the first RF amplifier stage. Less DC power is consumed since no circuitry is used exclusively for establishing a DC reference.

17 Claims, 3 Drawing Sheets

HIGH EFFICIENCY, UNILATERAL DUAL STAGE RF AMPLIFIER

BACKGROUND OF THE INVENTION

(1) Field of the Invention

The present invention relates generally to radio frequency (RF) power amplifiers and, more particularly, to an RF power amplifier having a first-stage (driver) that also provides a DC current reference for an output stage.

(2) Description of the Prior Art

Amplifier architectures generally used in RF power amplifier output and driver (intermediate) stages intended for application in battery powered communications equipment often utilize DC bias circuitry. Such circuitry is used to establish a DC (current or voltage) reference for the active (amplifying) portion of the RF power amplifier. Because the DC current in the DC bias reference circuitry is not used by the RF power amplifier to amplify the incoming RF signal, this portion of the DC power consumed is inherently dissipated, thereby reducing the overall efficiency of RF power amplifiers, i.e. Class A and Class A/B amplifiers, used in those applications.

Class A amplifiers implemented in Gallium Arsenide (GaAs) Heterojunction Bipolar Transistor (HBT) processes, often utilize a reference current that is passed through a reference diode. The DC current that passes through the reference diode is generally "mirrored" to bias the output driver stage of the amplifier. Approximately one-eighth of the DC power consumed by the amplifier is often dissipated in the DC reference bias circuitry in order to mitigate variations in DC beta. Therefore, the power consumed in the bias stage is not useable to linearize devices in the active stage of the amplifier. This power loss is not desirable for small signal amplifier applications or where driver stages are used in power amplifiers.

Further, many multistage RF amplifiers utilize AC feedback from the output of the amplifier to the input of the amplifier to establish the input/output impedance of the amplifier and to linearize the transfer function of the amplifier. Amplifiers that utilize feedback from the output to the input inherently reduce desired reverse isolation and degrade the overall noise figure of the amplifier. In applications where the amplifier is used as a driver to an RF power amplifier, any such reduction in reverse isolation of the driver amplifier will make the cascade of amplifiers more prone to instability. Additionally, RF power amplifiers often exhibit large variations in input impedance due to changes in the load they are driving, e.g., antenna in a handheld wireless device. Driver amplifiers that do not provide adequate reverse isolation will reflect any such variation in input impedance from the power amplifier back to their input. Because the device preceding the driver amplifier is often a filter, variations in the driver amplifier input impedance will adversely effect the frequency response of the filter.

When associated with GaAs HBT amplifiers, DC bias circuitry must be designed to prevent thermal runaway that can damage the device. However, DC bias circuits in GaAs HBT amplifiers are prone to thermal runaway when current mirroring is implemented without DC feedback. Generally, thermal runaway can occur when biasing without negative DC feedback because of the negative temperature coefficient of the base-emitter voltage and the negative temperature coefficient of the DC beta of the device. In view of the above, DC feedback in the emitter (or base) of the active device and bias circuit is required to avoid damage to the device.

Thus, there remains a need for a new and improved RF amplifier architecture that overcomes the above described problems associated RF power amplifiers using DC bias circuitry to establish a DC reference for the active portion of the amplifier.

SUMMARY OF THE INVENTION

The present invention is directed to an RF amplifier architecture that utilizes the first-stage (preamplifier) of the amplifier as a temperature compensated, DC current reference for the output (second) stage of the amplifier. The first-stage comprises a transistor current source that is associated with a combination of output and feedback resistors to provide a process (DC beta) independent current reference to an active transistor amplifier such as known in the art. Specifically, the current reference can be designed such that the ratio of device areas between the first-stage transistor and the second-stage (active transistor amplifier) transistor is equal to the inverse ratio of a pair of resistors, e.g. collector-base feedback resistor and collector resistor. The current mirrored from the first-stage transistor to. the second-stage transistor in this manner is independent of DC beta. Use of the diode reference as a first RF amplifier stage is accomplished by transmitting the RF signal into the base of the first RF amplifier stage transistor and providing an AC bypass path around a resistor coupling the first RF amplifier stage transistor collector to the base of the second-stage transistor. Because no circuitry is used exclusively for establishing a DC reference, the invention consumes less DC power than other amplifier architectures using DC bias circuitry to establish a DC reference for the active portion of the amplifier.

Accordingly, one feature of the present invention includes an RF power amplifier architecture that uses a diode reference as both a DC current reference and a first RF amplifier stage simultaneously.

Another feature of the present invention includes a process independent current reference to an active amplifier that does not reduce the overall efficiency of Class A and Class A/B applications.

Still another feature of the present invention includes an RF power amplifier DC bias architecture that minimizes thermal runaway.

Yet another feature of the present invention includes an RF power amplifier having an internal feedback architecture that does not significantly impact reverse isolation characteristics of the RF power amplifier.

These and other features of the present invention will become apparent to those skilled in the art after a reading of the following description of the preferred embodiment when considered with the drawings.

BRIEF DESCRIPTION OF THE DRAWINGS

The drawings are for the purpose of describing a preferred embodiment of the invention and are not intended to limit the present invention.

DESCRIPTION OF THE PREFERRED EMBODIMENTS

Figure 1:
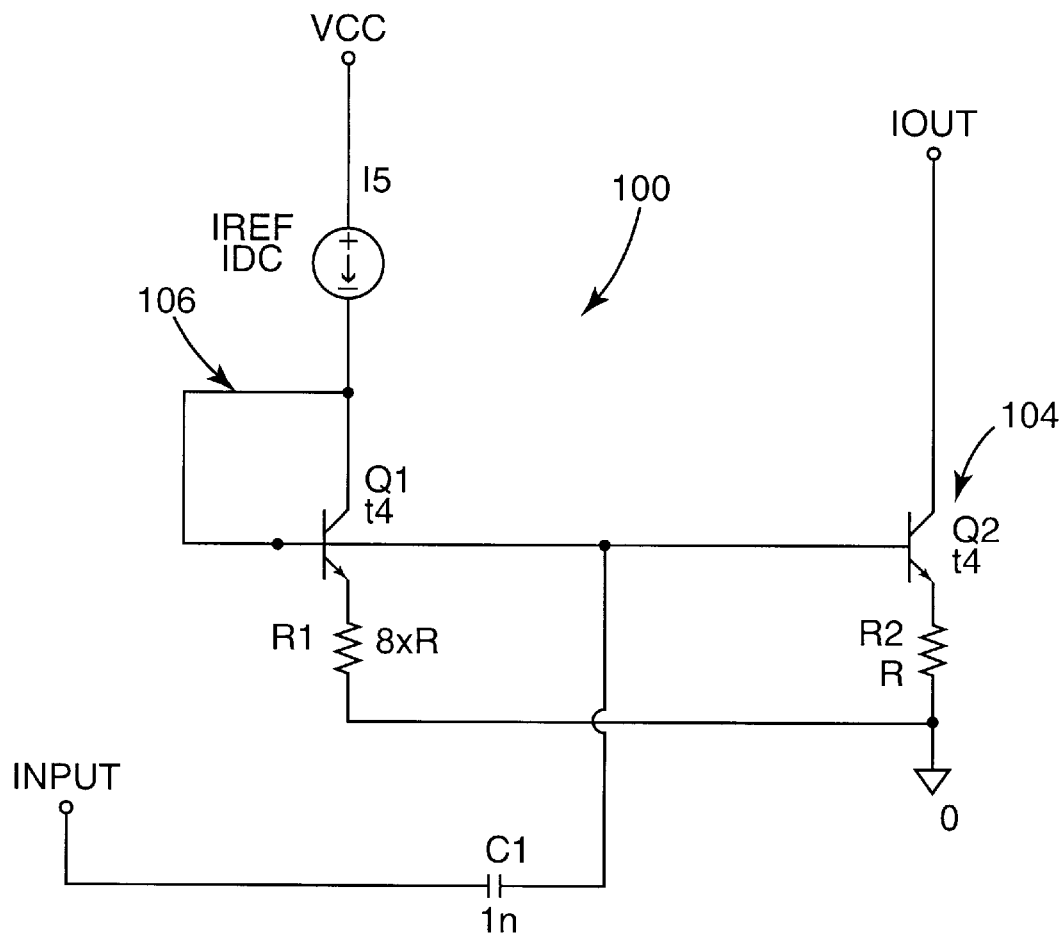
FIG. 1 is a schematic diagram illustrating a typical power amplifier DC bias architecture known in the art.

In the following description, like reference characters designate like or corresponding parts throughout the several views. Also, as used herein, efficiency is generally defined to be Power Added efficiency—Total RF Power OUT divided by total RF Power OUT plus DC power IN. Symbols used in the figures are as follows:

Any element with a label which has the prefix "R" or has the resistor symbol is a resistor.

Any element with a label which has the prefix "C" is a capacitor.

Any element with a label which has the prefix "L" is an inductor.

Any element with a label which has the prefix "Q" is a transistor.

The label "RFIN" refers to the input signal port of the amplifier.

The label "RFOUT" refers to the output signal port of the amplifier.

The label "VCC" refers to the power supply input connection.

The "Ground" symbol ∇refers to both signal and Power Supply common connection.

The "Battery" symbol ≢refers to a source of DC voltage.

Referring now to the drawings in general and FIG. 1 in particular, it will be understood that the illustrations are for the purpose of describing a preferred embodiment of the invention and are not intended to limit the invention thereto. As best seen in FIG. 1, a schematic diagram illustrating a typical power amplifier DC bias architecture 100 known in the art is shown. A reference diode 102 is formulated via the base-emitter portion of a bipolar transistor Q1 as can be seen in association with shorting the collector to the base of Q1. The DC current passing through the reference diode 102 is "mirrored" to bias the output stage 104 of the amplifier 100. In this arrangement, DC power is consumed by the DC reference bias circuitry 106 and is not available for use to linearize the transistor Q2 in the amplifier output stage 104 of the amplifier 100. Instead, the DC power consumed by the DC reference bias circuitry 106 has been dedicated to mitigate against variations in DC beta associated with the DC reference bias circuitry 106 in order to provide a stable current source.

Figure 2:
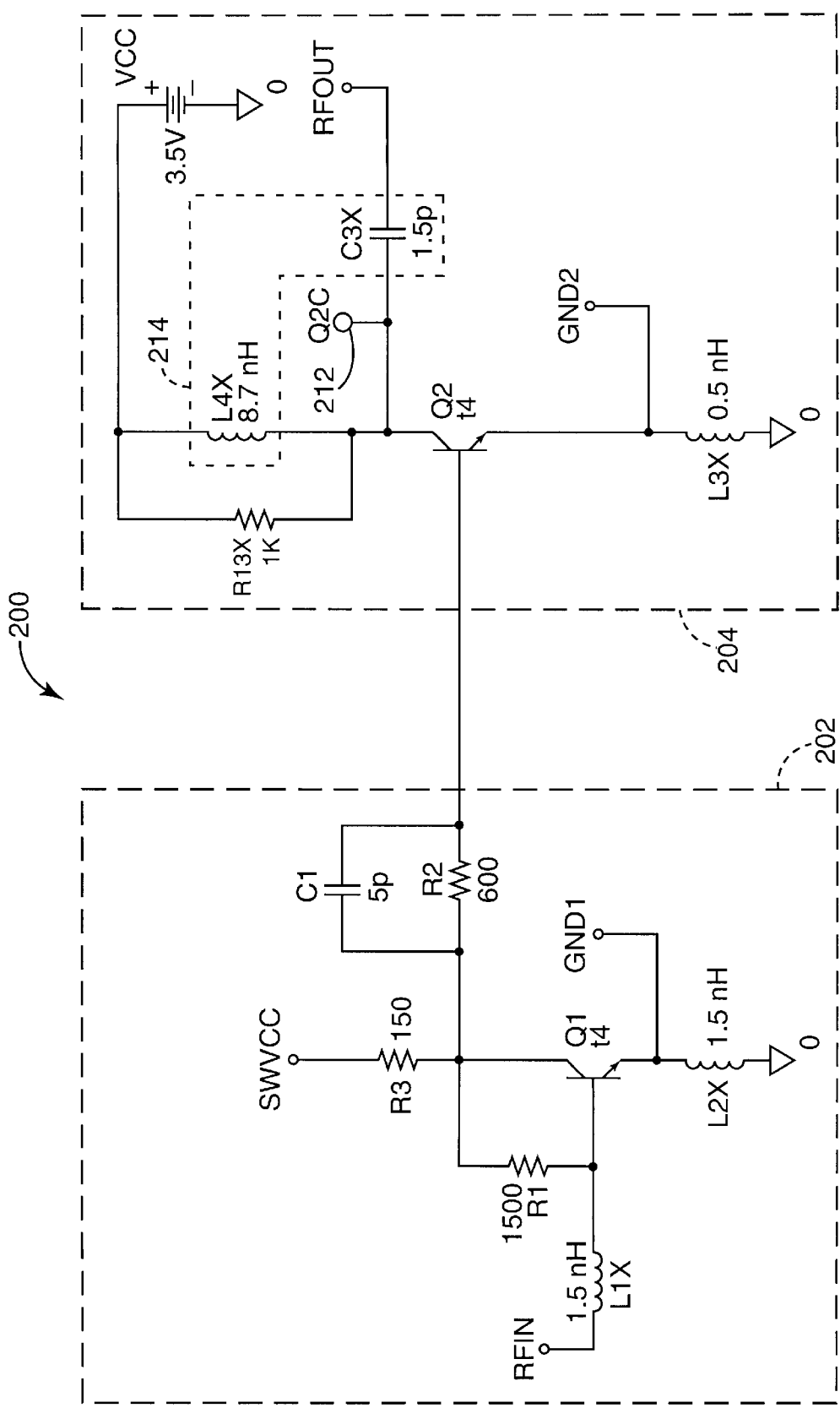
FIG. 2 is a schematic diagram illustrating a high efficiency, unilateral dual stage RF amplifier according to one embodiment of the present invention.

FIG. 2 contains a schematic diagram illustrating a high efficiency, unilateral dual stage RF amplifier 200 according to one embodiment of the present invention. RF amplifier 202 contains two stages; namely, 202, 204. The first-stage 202 of the RF amplifier 200 is configured as both a DC current reference and as the first RF amplifier stage. The first-stage 202 of the RF amplifier 200 comprises resistors R1, R2 and R3 in association with inductors L1X and L2X as well as capacitor C1 and transistor Q1. The resistors R1, R2 and R3 in combination with Q1 can provide a process (DC beta) independent current reference to an active amplifier. Specifically, and with continued reference to FIG. 2, the inverse ratio of resistance values of resistor R1 to resistor R2 is set equal to the ratio of device areas between transistor Q1 and transistor Q2. Under this condition, the current mirrored from transistor Q1 to transistor Q2 will be independent of DC beta.

In addition, the first-stage 202 is configured to function as a driver stage by transmitting an RF signal to the base of transistor Q1 and by providing an AC bypass capacitor C1 around resistor R2 to provide a signal path to the output stage transistor Q2. Because no circuitry associated with the RF amplifier 200 functions exclusively as a DC reference, the RF amplifier 200 consumes less power than conventional power amplifiers known in the art such as that shown in FIG. 1.

With continued reference to FIG. 2, a voltage shunt feedback loop is formulated using a resistor R1 from the output (collector) of Q1 to the input (base) of Q1 to linearize the input stage 202. Inductive series feedback via an inductor L2X from the emitter of Q1 to ground functions to provide an input match to 50 ohms for the first (input) RF amplifier stage 202. The RF amplifier 200 also uses inductive series feedback via inductor L3X from the emitter of Q2 to ground to linearize the output stage 204 of the amplifier 200. Because feedback is incorporated locally in each stage 202, 204 of the amplifier 200, the reverse isolation characteristics of the amplifier 200 are improved over architectures that use feedback from the amplifier output back to the amplifier input. This configuration of multiple feedback loops also allows for independent optimization of the amplifier's gain, noise figure, linearity and input impedance characteristics.

As also shown in FIG. 2, DC feedback is used in the base circuit of each amplifier stage 202, 204. DC feedback is provided by resistor R1 in the first amplifier stage 202 and by resistor R2 in the output stage 204 of the amplifier 200. As each device (Q1 and Q2) attempts to runaway thermally, the base (and collector) current will begin to also increase. Specifically, as the base current in each device, Q1 and Q2, increases, there is a corresponding increase in the voltage drop across resistor R1 and resistor R2. The corresponding increase in the voltage drop across R1 and R2 as the base current in Q1 and Q2 increases provides the necessary DC feedback to prevent thermal runaway.

Figure 3:
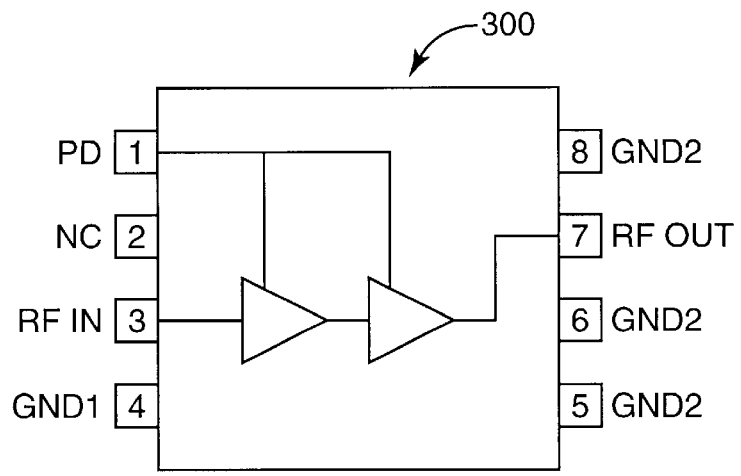
FIG. 3 is a functional block diagram according to one embodiment of the present invention that is suitable for use in association with transmit digital PCS applications.

FIG. 3 is a functional block diagram 300 according to one embodiment of the present invention that is suitable for use in association with transmit digital personal communication system (PCS) applications. Specifically, the functional block diagram 300 is associated with a model RF2324 power amplifier driver available from RF Micro-Devices, Inc. of Greensboro, N.C. The RF2324 power amplifier uses one embodiment of the present invention in association with a commercial GaAs HBT process technology. GaAs HBT technology was chosen for its high breakdown voltage, gain, available power, efficiency and single supply operation. HBT devices generally are formulated on a semi-insulating substrate by using Molecular Beam Epitaxy (MBE). Silicon is used for the n-type dopant and beryllium for the p-type dopant. The devices are fabricated using a self-aligning ohmic metal process where a double photoresist liftoff technique aligns the base ohmic contact to within 0.15 um of the emitter mesa edge. The emitter and base mesa are formed by wet etch and boron implantation provides device isolation. An As/Ga flux ration of 3:1 is utilized with a substrate temperature at approximately 570° C. The resulting profile is optimized for reliability. HBT devices have been found to provide the best voltage compliance for a wideband amplifier. Further, the HBT base-collector capacitance is small and much more constant then either the Si BJT or the MESFET. Industry experience has shown that superior wideband linear amplifiers can be formulated using GaAs HBT devices. GaAs HBT technology uses a GaAs/AlGaAs heterostructure for producing bipolar devices among others.

With continued reference to FIG. 3, and with particular reference to the herein before described RF2324 driver amplifier, the corresponding amplifier architecture which comprises the RF amplifier 200 shown in FIG. 2, has been optimized as a power amplifier driver at 1880 MHz in one embodiment. The amplifier is packaged in a Mini-Shrink Outline plastic package (MSOP-8). The MSOP-8 package and associated lead and bondwire inductances are used as an integral part of the amplifier design at 1880 MHz. The ratio of emitter areas Q1/Q2 and current densities associated with the RF2324 driver amplifier have also been optimized to achieve an input match to 50 ohms, a low noise figure and high third-order intercept point at 1880 MHz. As set forth in FIG. 2, RF amplifier 200 includes two DC voltage inputs for biasing. The SWVCC input 210 is intended to be biased from a switched regulated (external) supply in one application. In one embodiment, the SWVCC input 210 can be grounded to accomplish a power off mode. The collector of Q2 is pinned out (open collector) 212 to supply DC bias to the output stage 204 of the RF amplifier 200 and also to impedance match the collector of Q2. In one embodiment, a shunt-L, series-C external matching circuit 214 (L4X and C3X) is used to match the collector of Q2 and maximize the output power available from the RF amplifier 200.

Figure 4:
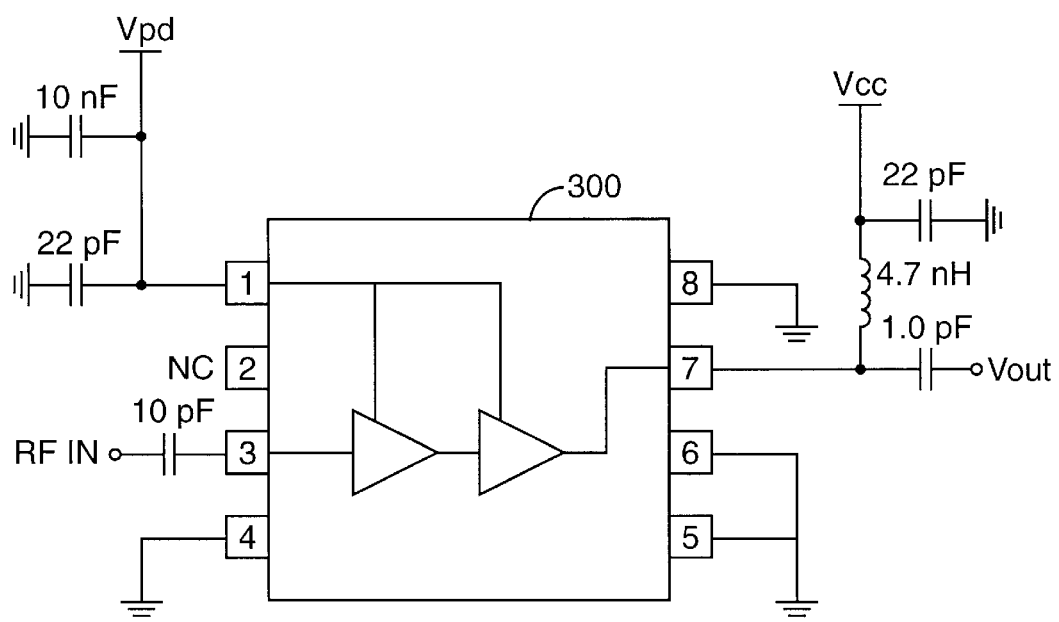
FIG. 4 is a schematic diagram illustrating the functional block diagram depicted in FIG. 3 modified for use at approximately 1880 MHz according to one embodiment.

FIG. 4 is a schematic diagram illustrating the RF2324 functional block diagram 300 depicted in FIG. 3, but modified for use at approximately 1880 MHz according to one embodiment. In operation, pin 1 is used to allow power down of the RF2324 when Vpd is less than 0.9 volts or turn on the RF2324 when Vpd reaches about 2.8 volts. External bypassing such as depicted, is required to achieve optimum functionality. Pin 3 in the RF input pin and is DC coupled and matched to a 50 ohm load at 1880 MHz as stated herein before. Pin 7 is the RF2324 output pin and is an open collector output as discussed above. In operation, pin 7 is required to be biased to either Vcc or pin 8 through a choke or matching inductor such as depicted in FIG. 4. Generally, pin 7 is matched to 50 ohms with a shunt bias/matching inductor and series blocking/matching capacitor.

Certain modifications and improvements will occur to those skilled in the art upon a reading of the foregoing description. By way of example, the present invention has been realized in a GaAs HBT process, but could just as well be realized in any bipolar integrated process technology, e.g. silicon. It can be appreciated that the ratio of emitter areas associated with Q1/Q2 and the package would need to be optimized for other applications at other frequencies. However, the novel amplifier architecture would remain the same. Further, the present invention has been realized using particular combinations of components, i.e. resistors, capacitors, inductors, transistors and the like. It can also be appreciated that combinations of these components may be interchangeable under specific conditions dependent upon factors such as operating frequency. Thus, in certain applications, a resistive device could be implemented from a device other than a resistor, e.g. RF choke or combination of other devices. It should be understood that all such modifications and improvements have been deleted herein for the sake of conciseness and readability but are properly within the scope of the following claims.

I claim:

1. A unilateral, dual stage RF amplifier comprising:
    an RF output amplifier stage comprising a bipolar transistor; and
    an RF preamplifier stage to the RF output amplifier stage comprising at least one feedback device, the RF preamplifier stage configured as a DC Beta independent current reference for the RF output amplifier stage, and the at least one feedback device configured to linearize the RF preamplifier stage and further configured to minimize thermal runaway associated with the RF preamplifier stage.

2. The unilateral, dual stage RF amplifier according to claim 1 wherein the RF preamplifier stage further comprises at least one feedback device configured to provide an input match to a predetermined impedance.

3. The unilateral, dual stage RF amplifier according to claim 2 further comprising a feedback device coupling the RF preamplifier stage to the RF output amplifier stage such that thermal runaway of the bipolar transistor is minimized.

4. The unilateral, dual stage RF amplifier according to claim 3 further comprising an RF signal bypass device configured to provide an RF signal path from the DC Beta independent current reference to the RF output amplifier stage.

5. A unilateral, dual stage RF amplifier comprising:
    a bipolar RF power amplifier; and
    a driver amplifier comprising a first resistive device configured to substantially eliminate thermal runaway associated with the driver amplifier, said driver amplifier configured to preamplify an RF input signal to the RF power amplifier and further configured to provide a temperature independent reference current to the bipolar RF power amplifier.

6. The unilateral, dual stage RF amplifier according to claim 5 wherein the driver amplifier further comprises a second resistive device configured to substantially eliminate thermal runaway associated with the bipolar RF power amplifier.

7. The unilateral, dual stage RF amplifier according to claim 6 further comprising an RF signal bypass device configured to substantially eliminate RF signal blocking characteristics associated with the second resistive device.

8. A unilateral, dual stage RF amplifier comprising:
    an RF power amplifier having a bipolar transistor with associated base, emitter and collector elements and further having an RF signal input and an RF signal output;
    a DC Beta independent current source having a bipolar transistor with associated base, emitter and collector elements and further having an RF signal input, an RF signal output and a reference current output;
    an RF signal path electrically coupled from the current source RF signal output to the RF power amplifier RF signal input; and
    a DC current feedback path electrically coupled from the current source reference current output to the RF power amplifier RF signal input.

9. The unilateral, dual stage RF amplifier according to claim 8 wherein the current source further comprises a resistive device electrically coupled from the current source bipolar transistor collector to the current source bipolar transistor base.

10. The unilateral, dual stage RF amplifier according to claim 9 wherein the RF signal path comprises a capacitive device.

11. The unilateral, dual stage RF amplifier according to claim 10 wherein the DC current feedback path comprises a resistive device.

12. A unilateral, dual stage RF amplifier comprising:
    an RF output amplifier;
    preamplifying means for generating a temperature compensated reference current and providing a driver RF signal to the RF output amplifier; and
    means for mirroring the reference current to the RF output amplifier; said preamplifying means comprising a first bipolar transistor having a base element, a collector element, and an emitter element, and further comprising a resistor electrically coupling said base and collector elements of said first bipolar transistor.

13. The unilateral, dual stage RF amplifier according to claim 12 wherein the RF output amplifier comprises a second bipolar transistor having a base element, a collector element and a emitter element.

14. The unilateral, dual stage RF amplifier according to claim 13 where the mirroring means comprises a resistor coupled to the first bipolar transistor collector element at one end and coupled to the second bipolar transistor base element at the opposite end.

15. A method for providing a temperature independent reference current to an RF power amplifier, said method comprising the steps of:
   (a) providing an RF power amplifier having an RF input and an RF output;
   (b) providing a DC beta independent current reference having an RF input and RF output;
   (c) generating a bias current for the RF power amplifier via the DC beta independent current reference;
   (d) outputting an RF driver signal from the RF output of the DC beta independent current reference responsive to an RF signal to be amplified applied to the RF input of the DC beta independent current reference; and
   (e) transmitting the RF driver signal to the RF power amplifier from the DC beta independent current reference.

16. A unilateral, dual stage RF amplifier comprising:

an RF output amplifier stage including a bipolar transistor;

an RF preamplifier stage configured as a DC Beta independent current reference for the RF output amplifier stage, the RF preamplifier stage including at least one feedback device configured to linearize the RF preamplifier stage and further configured to minimize thermal runaway associated with the RF preamplifier stage, the RF preamplifier stage further including at least one feedback device configured to provide an input match to a predetermined impedance;

a feedback device coupling the RE preamplifier stage to the RF output amplifier stage such that thermal runaway of the bipolar transistor is minimized; and an RF signal bypass device configured to provide an RF signal path from the DC Beta independent current reference to the RF output amplifier stage.

17. A unilateral, dual stage RF amplifier comprising:

an RF power amplifier having a bipolar transistor with associated base, emitter and collector elements and further having an RF signal input and an RF signal output;

a DC Beta independent current source having a bipolar transistor with associated base, emitter and collector elements and further having an RF signal input, an RF signal output and a reference current output and further having a resistor electrically coupled from the current source bipolar transistor collector to the current source bipolar transistor base;

an RF signal path electrically coupled from the current source RF signal output to the RF power amplifier RF signal input, the RF signal path comprising a capacitor; and a DC current feedback path electrically coupled from the current source reference current output to the RF power amplifier RF signal input, the DC current feedback comprising a resistor.

* * * * *